(12) United States Patent
Ogawa et al.

(10) Patent No.: US 6,589,857 B2
(45) Date of Patent: Jul. 8, 2003

(54) MANUFACTURING METHOD OF SEMICONDUCTOR FILM

(75) Inventors: Masahiro Ogawa, Higashiosaka (JP); Daisuke Ueda, Ibaraki (JP); Masahiro Ishida, Hirakata (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 10/100,118

(22) Filed: Mar. 19, 2002

(65) Prior Publication Data

US 2002/0137248 A1 Sep. 26, 2002

(30) Foreign Application Priority Data

Mar. 23, 2001 (JP) .................. 2001-084806

(51) Int. Cl.[7] .................. H01L 21/20; H01L 21/36
(52) U.S. Cl. .................. 438/502; 438/509; 438/458
(58) Field of Search .................. 438/500, 502, 438/507, 509, 977, 458

(56) References Cited

U.S. PATENT DOCUMENTS

| | | | |
|---|---|---|---|
| 4,990,388 A | * 2/1991 | Hamada et al. | 346/135.1 |
| 5,258,322 A | * 11/1993 | Sakaguchi et al. | 438/507 |
| 6,071,795 A | 6/2000 | Cheung et al. | |
| 6,143,628 A | * 11/2000 | Sato et al. | 438/455 |
| 6,335,263 B1 | * 1/2002 | Cheung et al. | 438/455 |
| 6,420,242 B1 | * 7/2002 | Cheung et al. | 438/458 |

FOREIGN PATENT DOCUMENTS

| | | |
|---|---|---|
| JP | 10-256662 | 9/1998 |
| JP | 11-126758 | 5/1999 |
| JP | 11-186174 | 7/1999 |
| JP | 2000-12900 | 1/2000 |
| JP | 2000-91632 | 3/2000 |
| JP | 2001-501778 | 2/2001 |

OTHER PUBLICATIONS

M. K. Kelly et al., "Large Free–Standing GaN Substrates by Hydride Vapor Phase Epitaxy and Laser–Induced Liftoff", Japanese Journal of Applied Physics, Vol. 38 (1999) pp. L217–L219, Part 2, No. 3A, Mar. 1, 1999.

* cited by examiner

Primary Examiner—Carl Whitehead, Jr.
Assistant Examiner—William Vesperman
(74) Attorney, Agent, or Firm—Nixon Peabody LLP; Donald R. Studebaker

(57) ABSTRACT

A first semiconductor film made of a nitride semiconductor is grown through epitaxial growth on a light transmitting substrate. A thermal decomposition layer is disposed in a space between the substrate and the first semiconductor film by irradiating laser light to the first semiconductor film from the back surface of the substrate. After a second semiconductor film made of a nitride semiconductor is grown through epitaxial growth while the first semiconductor film is placed on the substrate, the temperature of the substrate is lowered to room temperature. Then, by separating and removing the substrate from the first and second semiconductor films, it is possible to obtain a nitride semiconductor substrate having an area substantially as large as the area of the substrate.

11 Claims, 7 Drawing Sheets

LASER LIGHT

MANUFACTURING METHOD OF SEMICONDUCTOR FILM

BACKGROUND OF THE INVENTION

The present invention relates to a manufacturing method of a semiconductor film or a semiconductor substrate used when fabricating semiconductor devices, such as a semiconductor laser and a field effect transistor.

Conventionally, it has been known that a compound semiconductor including N and at least one element selected from Ga, Al, B, As, In, P and Sb in its composition (hereinafter, referred to as nitride semiconductor) has a broad bandgap from 1.9 to 6.2 eV and broad bandgap energy from the ultraviolet region to the visible region. Therefore, it is a potential semiconductor material for light emitting and light receiving devices. A typical example of the nitride semiconductor is a compound semiconductor whose composition is expressed by a general formula $B_xAl_yGa_zIn_{1-x-y-z}N$, where $0 \leq x \leq 1$, $0 \leq y \leq 1$, $0 \leq z \leq 1$, and $0 \leq x+y+z \leq 1$. A nitride semiconductor device is fabricated by chiefly using sapphire as a crystal growth substrate, and a light emitting diode using a GaN film formed on a sapphire substrate and a nitride semiconductor film formed on the GaN film has been commercially available to date.

However, a lattice misfit ratio between the sapphire substrate and GaN is quite high at approximately 16%, and a density of defects of the GaN film grown on the sapphire substrate reaches as high as $10^9$ to $10^{10}$ cm$^{-2}$. Such a high density of defects causes a shortened useful life of, among others, a blue semiconductor laser fabricated on the sapphire substrate.

Here, the most ideal substrate available in manufacturing the GaN film is, naturally, a GaN substrate. However, in regard to GaN, nitrogen has an extremely high equilibrium vapor pressure in comparison with Ga, and for this reason, it is difficult to allow bulk crystal growth by the conventional pulling method or the like. Hence, there has been proposed a manufacturing method of a nitride semiconductor substrate, by which a thick GaN film is grown on a substrate made of materials other than those of the nitride semiconductor, that is, a substrate made of heterogeneous materials (for example, a sapphire substrate, a SiC substrate, a Si substrate, a GaAs substrate, etc., which is hereinafter referred to as the hetero-substrate), and the hetero-substrate is removed later.

More specifically, as is described in Reference 1 (Japanese Patent Laid-open Publication No. Hei. 10-256662), there has been proposed a manufacturing method of a nitride semiconductor substrate, by which a thick GaN film is grown on a sapphire substrate at a high temperature, and the sapphire substrate is removed later by means of grinding.

Also, as is described in Reference 2 (Michael K. Kelly et al., *Japanese Journal of Applied Physics*, Vol. 38, p.L217, 1999), there has been proposed another manufacturing method of a nitride semiconductor substrate, by which a thick GaN film is grown on a sapphire substrate at a high temperature, and the GaN film is separated from the sapphire substrate by irradiation of a laser beam.

Further, as is described in Reference 3 (Japanese Patent Laid-open Publication No. 2000-12900), there has been proposed still another manufacturing method of a nitride semiconductor substrate, by which a mask provided with a window is formed on a GaAs substrate so that a GaN buffer layer is formed inside the window of the mask at a low temperature, then a thick GaN epitaxial layer is grown on the GaN buffer layer by the HVPE method at a high temperature, and the GaAs substrate is removed later.

However, these conventional manufacturing methods of a semiconductor film have common inconveniences as follows.

That is, because a high temperature at or above 1000° C. is necessary for the growth of GaN crystals, when GaN grown through epitaxial growth at a high temperature is cooled subsequently, it is affected by a difference in coefficients of thermal expansion between the GaN film thus grown and the hetero-substrate. To be more specific, when a thermal stress resulting from a difference in coefficients of thermal expansion is applied to the GaN film, a crack or a defect occurs in the GaN film or warpage occurs across the GaN film. In particular, when the GaN film is as thick as a few hundred micrometers approximately, a considerable thermal stress is applied to the GaN film, and warpage or a breaking occurs more frequently. Hence, it is difficult to cool the GaN film while securing an area substantially as large as that of the hetero-substrate.

SUMMARY OF THE INVENTION

It is therefore an object of the present invention to provide a manufacturing method of a semiconductor film capable of controlling the occurrence of a breaking or warpage while securing a nitride semiconductor film substantially as large as the substrate.

A manufacturing method of a semiconductor film of the present invention is a method, including: a step (a) of forming a first semiconductor film on a light transmitting substrate; a step (b) of separating contact between the substrate and the first semiconductor film at least at a part of an interface thereof by irradiating light in a space between the substrate and the first semiconductor film; and a step (c) of allowing growth of a second semiconductor film on the first semiconductor film while the first semiconductor film is placed on the substrate, at least the first and second semiconductor films being used as a semiconductor substrate.

According to this method, the light irradiation in the step (b) forms a thermal decomposition layer between the first semiconductor film and the substrate. When the substrate is cooled after the second semiconductor film is formed on the first semiconductor film in the step (c), the thermal decomposition layer absorbs the stress, thereby making it possible to reduce the stress applied to the second semiconductor film to the least possible.

In the step (b), at least a part of a region of the first semiconductor film adjacent to the substrate may be turned into the thermal decomposition layer. In such a case, in the step (b), the contact between the first semiconductor film and the substrate may be separated at the interface thereof almost entirely, or the contact between the first semiconductor film and the substrate may be separated only at a part of the interface thereof.

By arranging the manufacturing method so as to further include a step of forming a first mask provided with an opening portion on the substrate before the step (a), and in such a manner that, in the step (a), the first semiconductor film is grown on the substrate from a portion exposed through the opening portion of the first mask, it is possible to obtain the first semiconductor film with regions having fewer defects, such as a dislocation, above the mask.

By covering a side surface of the substrate with the first mask, it becomes easier to obtain a free-standing wafer by separating the substrate from the first and second semiconductor films.

The manufacturing method is preferably arranged in such a manner that the first mask transmits light, and in the step (b), contact between the first semiconductor film and the first mask is separated at least at a part of an interface thereof.

By arranging the manufacturing method so as to further include a step of forming, on the first semiconductor film, a second mask covering at least above the opening portion of the first mask and provided with an opening portion above the first mask after the step (a) and before the step (b), and in such a manner that, in the step (c), the second semiconductor film is grown on the first semiconductor film from a portion positioned at the opening portion of the second mask, it is possible to obtain the second semiconductor film having fewer defects as a whole.

The first mask is preferably formed from at least one film selected from an oxide film, a nitride film, an oxynitride film, and a refractory metal film.

By arranging the manufacturing method so as to further include a step of forming, on the first semiconductor film, a third mask provided with an opening portion and furnished with a function of interfering with crystal growth of the second semiconductor film after the step (a) and before the step (b), and in such a manner that, in the step (c), the second semiconductor film is grown on the first semiconductor film from a portion exposed through the opening portion of the third mask, it is possible to obtain the second semiconductor film with regions having fewer defects above the third mask.

By arranging the manufacturing method so as to further include a step of forming a fourth mask provided with an opening portion on the first semiconductor film after the step (a) and before the step (b), and a step of removing a region of the first semiconductor film positioned at the opening portion of the fourth mask by etching away the first semiconductor film with the fourth mask after the step (b) and before the step (c), and in such a manner that, in the step (c), the second semiconductor film is grown on the first semiconductor film from a portion exposed through the opening portion of the first semiconductor film, it is possible to obtain the second semiconductor film having a low density of defects as a whole.

In the step (a), a compound semiconductor film including nitrogen may be formed as the first semiconductor film.

In the step (a), a compound semiconductor film including N and at least one element selected from Ga, Al, B, As, In, P and Sb in a composition thereof may be formed as the first semiconductor film.

In the step (c), a compound semiconductor film including nitrogen may be formed as the second semiconductor film.

In the step (c), a compound semiconductor film including N and at least one element selected from Ga, Al, B, As, In, P and Sb in a composition thereof may be formed as the second semiconductor film.

In the step (a), it is preferable to se t a thickness of the first semiconductor film to 200 µm or less.

In the step (b), it is preferable that a value of irradiation energy of the light is set in a range from 0.1 J/cm$^2$ to 20 J/cm$^2$ both inclusive.

By further including a step (d) of removing the substrate after the step (c), it is possible to obtain the second semiconductor film functioning as a free-standing wafer.

DESCRIPTION OF PREFERRED EMBODIMENTS

First Embodiment

FIGS. 1A through 1E are partial cross sections (the illustration of the side surface of the substrate in the cross sections is omitted herein) showing a manufacturing method of a semiconductor film according to a first embodiment of the present invention.

Figure 1A:
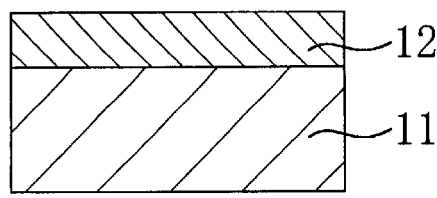
FIGS. 1A through 1E are partial cross sections showing a manufacturing method of a semiconductor film according to a first embodiment of the present invention.

Initially, in the step shown in FIG. 1A, a sapphire substrate 11 having its principal plane of a C plane, that is, a (0001) plane, and having a diameter of two inches (approximately 50.8 mm) and a thickness of 300 µm is prepared. Then, the sapphire substrate 11 is set in an HVPE apparatus, and from the upstream end of a reactor furnace, a GaCl gas produced by Ga metal and an HCl gas and an ammonia gas (NH$_3$) are supplied as raw material gases and a nitrogen gas (N$_2$) is supplied as a carrier gas while the sapphire substrate 11 is kept heated. According to this hydride vapor phase epitaxy method (HVPE method), a 30-nm-thick GaN buffer layer (not shown) is initially grown through epitaxial growth on the principal plane of the sapphire substrate 11 while the sapphire substrate 11 is kept heated at 500° C. Then, the temperature of the sapphire substrate 11 is raised to 1000° C., whereby a 50-µm-thick GaN film 12, which is a first semiconductor film, is grown through epitaxial growth. Herein, because the thickness of the GaN buffer layer is almost negligible in comparison with the thickness of the GaN film 12, hereinafter, the phrase "GaN film 12" is construed to include the GaN buffer layer unless otherwise specified. Also, the sapphire substrate 11 with the GaN film 12 or the like formed thereon is simply referred to as the epitaxial substrate.

Then, the sapphire substrate 11 and the GaN film 12 are cooled to room temperature within the HVPE apparatus.

At this point, the thickness of the GaN film 12 is approximately 50 µm, which is not too thick, and therefore, warpage occurs across the epitaxial substrate due to a difference in coefficients of thermal expansion between the sapphire substrate 11 and the GaN film 12, but such warpage is quite small. Also, a breaking or a chipping hardly occurs in the epitaxial substrate as a whole.

Herein, if the thickness of the GaN film 12 is increased, warpage becomes noticeable, and for this reason, when a sapphire substrate measuring two inches across is used, the thickness of the GaN film 12 is preferably 200 µm or less, and more preferably, 100 μm or less. It should be noted, however, that the upper limit of the preferable range as to the thickness of the GaN film 12 also depends on the thickness of the sapphire substrate 11 used. Also, in terms of controlling warpage and a breaking in the GaN film 12, no lower limit is set as to the thickness of the GaN film 12, and even if a total thickness of the GaN film 12 and GaN buffer layer is as small as 10 μm approximately, as long as the treatment discussed below is applicable, the advantages of the present invention can be exerted.

Figure 1B:
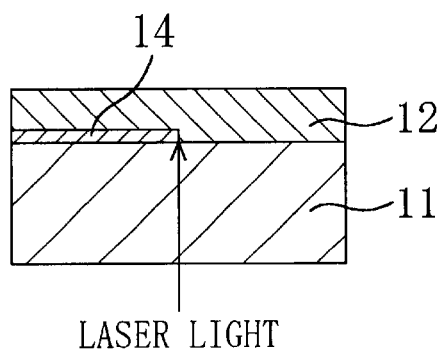

Then, in the step shown in FIG. 1B, the epitaxial substrate is taken out from the HVPE apparatus, and laser light is irradiated to the GaN film 12 (including the GaN buffer layer) from the back surface of the sapphire substrate 11, whereby the sapphire substrate 11 and GaN film 12 are separated from each other. A beam of laser used herein is the third harmonics (355 nm) from a Nd/YAG laser, and has irradiation energy of 0.3 J/cm$^2$, a pulse width of 5 ns, and a beam spot of 100 μm as a spot of irradiated laser light. The absorption edge wavelength of sapphire is shorter than a wavelength of the laser light, and the absorption edge wavelength of GaN (approximately 360 to 370 nm) is longer than the wavelength of the laser light. Hence, the laser light passes through the sapphire substrate 11, whereas GaN absorbs the laser light and generates heat. By increasing the energy density of the laser light satisfactorily, a portion of the GaN film 12 (including the GaN buffer layer) in contact with the sapphire substrate 11, that is, the back surface portion, is decomposed in the vicinity of the interface by the heat thus generated, whereby a thermal decomposition layer 14 resulting from the decomposition of GaN is formed in a space between the sapphire substrate 11 and the GaN film 12. In the present embodiment, such a phenomenon can be confirmed when the energy density of the laser light is nearly 0.4 J/cm$^2$ or higher.

Figure 1C:
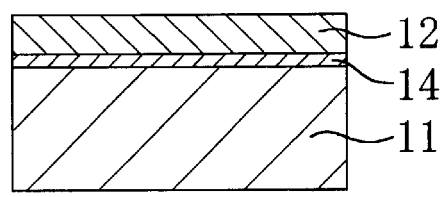

Hence, in the step shown in FIG. 1C, by scanning a beam of laser light to the sapphire substrate 11 entirely, the thermal decomposition layer 14 resulting from the decomposition of GaN is disposed entirely in a space between the sapphire substrate 11 and the GaN film 12. In general, the thermal decomposition layer 14 is a phase present as a mixture of liquid-drops of Ga, that is, droplets of Ga formed when N evaporates, and solid fine particles.

Then, by using the surface tension of the thermal decomposition layer 14, it is possible to allow the sapphire substrate 11 and the GaN film 12 to adhere to each other. A preferable quantity of droplets of Ga to allow the sapphire substrate 11 and the GaN film 12 to adhere to each other by means of the thermal decomposition layer 14 is determined by irradiation energy of a beam of laser, and a value of the energy is in a range from 0.1 J/cm$^2$ to 20 J/cm$^2$.

Figure 1D:
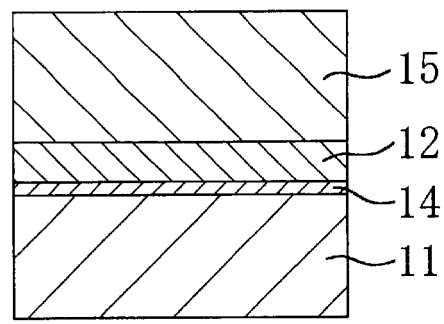

Then, in the step shown in FIG. 1D, the epitaxial substrate is introduced again into the HVPE apparatus while the GaN film 12 is placed on the sapphire substrate 11. Then, the epitaxial substrate is subjected to thermal cleaning by being heated to 700° C., after which the temperature of the epitaxial substrate is raised to 1000° C., whereby a 500-μm-thick GaN film 15, which is a second semiconductor film, is grown through epitaxial growth on the GaN film 12.

Figure 1E:
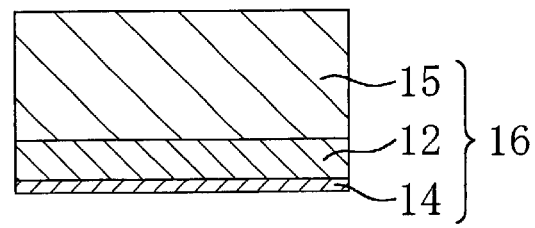

Subsequently, in the step shown in FIG. 1E, the temperature of the substrate is lowered to room temperature.

At this point, even if the sapphire substrate 11 and the GaN films 12 and 15 adhere to each other by means of the thermal decomposition layer 14, because the thermal decomposition layer 14 is composed of a fluid including liquid-drops, a thermal stress resulting from a difference in coefficients of thermal expansion between the sapphire substrate 11 and the GaN films 12 and 15 is applied little to the GaN films 12 and 15. Then, the sapphire substrate 11 is separated and removed from the GaN film 12 and the GaN film 15. As a result, a GaN substrate 16 having an area substantially as large as that of the sapphire substrate 11 is formed from the GaN films 12 and 15 and the thermal decomposition layer 14.

According to the manufacturing method of the semiconductor film of the present embodiment, laser light is irradiated to the GaN film 12 (including the GaN buffer layer in the present embodiment), which is the thin first semiconductor film formed on the sapphire substrate 11, from the back surface of the sapphire substrate 11, and the thick GaN film 15 is grown through epitaxial growth after the sapphire substrate 11 is separated from the GaN film 12. Hence, when the epitaxial substrate is cooled later, the GaN films 12 and 15 are already separated from the sapphire substrate 11 by means of the thermal decomposition layer 14, so that a thermal stress resulting from a difference in coefficients of thermal expansion is hardly produced even if the GaN film 15 is grown thick. Hence, it is possible to obtain the GaN substrate 16 hardly causing a breaking or warpage while securing a large area, which will be made into a so-called free-standing nitride semiconductor wafer (a wafer made of only the nitride semiconductor excluding any material other than the nitride semiconductor).

Thermal decomposition during irradiation of a laser beam leaves irregular projections and depressions on the back surface of the GaN substrate 16, that is, the surface on the GaN film 12 side, and the back surface may be polished until it becomes flat.

Second Embodiment

FIGS. 2A through 2E are partial cross sections (the illustration of the side surface of the substrate at the both ends is omitted herein) showing a manufacturing method of a semiconductor film according to a second embodiment of the present invention.

Figure 2A:
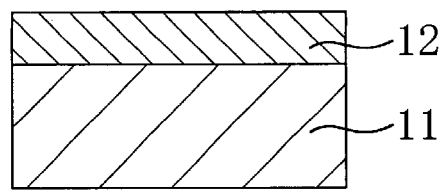
FIGS. 2A through 2E are partial cross sections showing a manufacturing method of a semiconductor film according to a second embodiment of the present invention.

In the step shown in FIG. 2A, the same treatment as the one in the step shown in FIG. 1A of the first embodiment is applied. More specifically, a GaN buffer layer (not shown) and a GaN film 12 are grown through epitaxial growth on a sapphire substrate 11 through the HVPE method. The conditions specified in the first embodiment are applied herein.

In the present embodiment also, the phrase "GaN film 12" is construed to include the GaN buffer layer unless otherwise specified. In addition, the sapphire substrate 11 with the GaN film 12 or the like formed thereon is simply referred to as the epitaxial substrate.

Then, the sapphire substrate 11 and the GaN film 12 are cooled to room temperature within the HVPE apparatus.

At this point, the thickness of the GaN film 12 of the present embodiment is approximately 10 μm, which is not too thick, and therefore, warpage occurs across the epitaxial substrate due to a difference in coefficients of thermal expansion between the sapphire substrate 11 and the GaN film 12, but such warpage is quite small. Also, a breaking or a chipping hardly occurs in the epitaxial substrate as a whole.

Figure 2B:
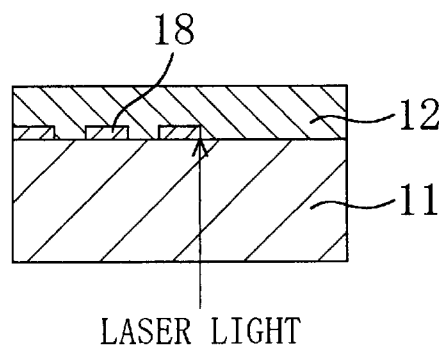

Then, in the step shown in FIG. 2B, the epitaxial substrate is taken out from the HVPE apparatus, and laser light is irradiated to the GaN film 12 (including the GaN buffer layer) from the back surface of the sapphire substrate 11, whereby the sapphire substrate 11 and GaN film 12 are separated from each other. A beam of laser specified in the first embodiment is also used herein. Hence, like in the first embodiment, GaN is decomposed in a portion of the back surface portion of the GaN film 12 where laser light was irradiated, whereby the GaN film 12 at a region where laser light was irradiated is separated from the sapphire substrate 11. Then, in the region where laser light was irradiated, a thermal decomposition layer 14 resulting from decomposition of GaN is disposed in a space between the sapphire substrate 11 and the GaN film 12. In the present embodiment also, such a phenomenon can be confirmed when the energy density of the laser light is nearly 0.4 J/cm$^2$ or higher.

At this point, in the present embodiment, as shown in FIG. 2B, a beam of laser light scans the sapphire substrate 11 linearly in the <1 1–2 0> direction, and such linear scanning is repeated with a pitch interval of 1 mm in a direction that intersects at right angles with the <1 1–2 0> direction. Here, in the index <1 1–2 0>, "–2" represents a code "2 bar", which is defined according to the conventions of the indices for the crystalline structure. In short, "bar" is expressed by a minus sign and precedes a figure. Hereinafter, as to the plane orientation, for example, "2 bar" is expressed as "–2" according to the indices.

Figure 2C:
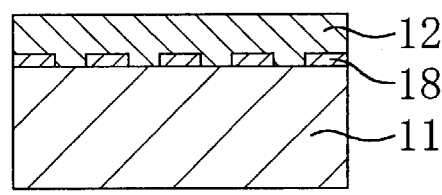

Then, in the step shown in FIG. 2C, by scanning a beam of laser light across the sapphire substrate 11, a thermal decomposition layer 18 resulting from decomposition of GaN is disposed in a space between the sapphire substrate 11 and the GaN film 12 in a stripe pattern having its lengthwise direction in the <1 1–2 0> direction. The thermal decomposition layer 18 is generally a phase present as a mixture of liquid-drops of Ga, that is, droplets of Ga formed when N evaporates, and solid fine particles.

Figure 2D:
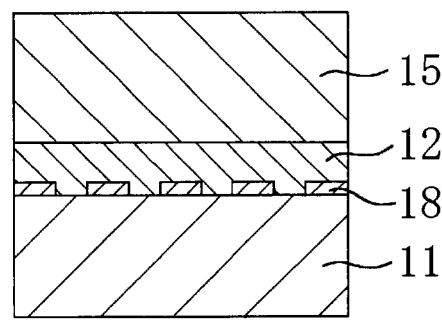

Then, in the step shown in FIG. 2D, the epitaxial substrate is introduced again into the HVPE apparatus while the GaN film 12 is placed on the sapphire substrate 11. Then, the epitaxial substrate is subjected to thermal cleaning by being heated to 700° C., after which the temperature of the epitaxial substrate is raised to 1000° C., whereby a 500-μm-thick GaN film 15, which is a second semiconductor film, is grown through epitaxial growth on the GaN film 12.

Subsequently, the temperature of the substrate is lowered to room temperature. At this point, the sapphire substrate 11 and the GaN film 12 are in contact with each other only partially because of the presence of the stripe-wise thermal decomposition layer 18, and for this reason, a thermal stress produced while the temperature is lowered is reduced compared with a thermal stress produced when the sapphire substrate 11 and the GaN film 12 are in contact with each other entirely.

Figure 2E:
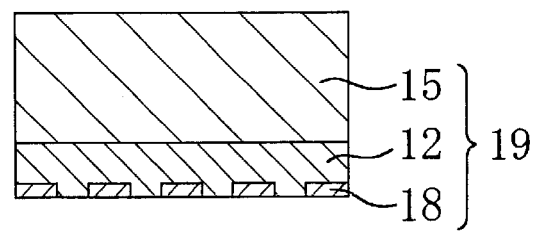

Then, in the step shown in FIG. 2E, the sapphire substrate 11 is separated and removed from the GaN film 12 and the GaN film 15 by decomposing a region of the GaN film 12 in contact with the sapphire substrate 11 with irradiation of a laser beam again or by grinding the sapphire substrate 11. As a result, a GaN substrate 19 (free-standing nitride semiconductor wafer) having an area substantially as large as that of the sapphire substrate 11 is formed from the GaN films 12 and 15 and the thermal decomposition layer 18.

In the present embodiment, when the epitaxial substrate is cooled after the GaN film 15 is formed, a thermal stress resulting from a difference in coefficients of thermal expansion between the sapphire substrate 11 and the GaN films 12 and 15 and applied to the GaN films 12 and 15 is so weak that it is possible to suppress the occurrence of a breaking and warpage in the GaN films 12 and 15. In particular, the present embodiment can offer an advantage that the HVPE process and raising and dropping of the temperature can be conducted during the epitaxial growth of the GaN film 15 while keeping the in-contact state of the GaN film 12 and the sapphire substrate 11 in a more secure manner.

In particular, if the sapphire substrate 11 is separated and removed from the GaN films 12 and 15 after the cooling, substantially no thermal stress is applied to the GaN substrate 19. As a result, it is possible to obtain the GaN substrate 19, which is a free-standing wafer measuring two inches across.

Thermal decomposition during irradiation of a laser beam leaves irregular projections and depressions on the back surface of the GaN substrate 19, that is, the surface on the GaN film 12 side, and the back surface may be polished until it becomes flat.

Also, the stripe-wise thermal decomposition layer 18 is formed partially in a space between the sapphire substrate 11 and the GaN film 12. It should be appreciated, however, that the pattern of the partially formed thermal decomposition layer 18 is not limited to a stripe-wise pattern, and the same advantages as those in the present embodiment can be exerted whether the pattern is a dot-wise pattern, a tessellated pattern, etc.

In addition, in the present embodiment, the sapphire substrate 11 is removed from the GaN films 12 and 15. However, the sapphire substrate 11 may be left intact, so that all the sapphire substrate 11 and the GaN films 12 and 15 are used as one substrate in fabricating a device, such as a laser element.

Third Embodiment

FIGS. 3A through 3E are partial cross sections (the illustration of the side surface of the substrate at the both ends is omitted herein) showing a manufacturing method of a semiconductor film according to a third embodiment of the present invention.

Figure 3A:
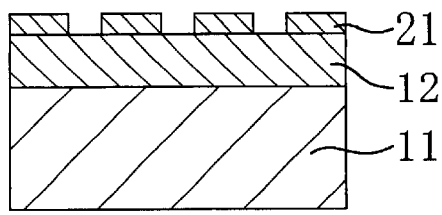
FIGS. 3A through 3E are partial cross sections showing a manufacturing method of a semiconductor film according to a third embodiment of the present invention.

In the step shown in FIG. 3A, the same treatment as the one in the step shown in FIG. 1A of the first embodiment is applied. More specifically, a 30-nm-thick GaN buffer layer (not shown) and a 50-μm-thick GaN film 12 are grown through epitaxial growth on a sapphire substrate 11 by the HVPE method. The conditions specified in the first embodiment are applied herein.

In the present embodiment also, the phrase "GaN film 12" is construed to include the GaN buffer layer unless otherwise specified. In addition, the sapphire substrate 11 with the GaN film 12 or the like formed thereon is simply referred to as the epitaxial substrate.

Then, the sapphire substrate 11 and the GaN film 12 are cooled to room temperature within the HVPE apparatus.

Subsequently, a 100-nm-thick SiO$_2$ film is formed on the GaN film 12 by means of sputtering, and the SiO$_2$ film is patterned by means of photolithography and wet etching, whereby a mask 21 made of SiO$_2$ is formed. The mask 21 has a stripe pattern having a width of 5 μm and a pitch interval of 5 μm, and the lengthwise direction of the stripe pattern is the <1 1–2 0> direction of the GaN film 12.

Figure 3B:
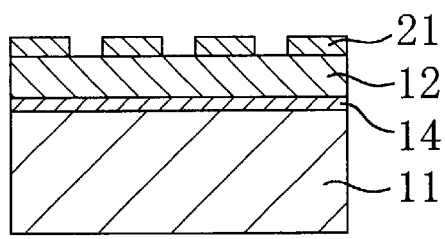

Then, in the step shown in FIG. 3B, the epitaxial substrate is taken out from the HVPE apparatus, and laser light is irradiated to the GaN film 12 (including the GaN buffer layer) from the back surface of the sapphire substrate 11, whereby the sapphire substrate 11 and GaN film 12 are separated from each other. A beam of laser and a beam spot of the laser light specified in the first embodiment are also used herein. Hence, by scanning a beam of laser light to the sapphire substrate 11 entirely, a thermal decomposition layer 14 resulting from decomposition of GaN is disposed entirely in a space between the sapphire substrate 11 and the GaN film 12. The thermal decomposition layer 14 is generally a phase present as a mixture of liquid-drops of Ga, that is, droplets of Ga formed when N evaporates, and solid fine particles.

Figure 3C:
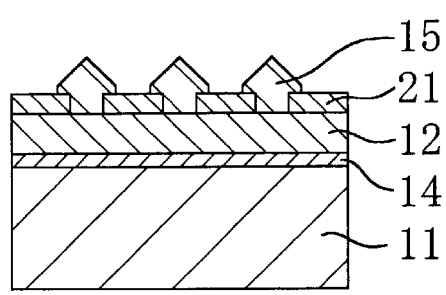

Then, in the step shown in FIG. 3C, the epitaxial substrate is introduced again into the HVPE apparatus while the GaN film 12 is placed on the sapphire substrate 11. Then, the epitaxial substrate is subjected to thermal cleaning by being heated to 700° C., after which the temperature of the epitaxial substrate is raised to 1000° C., whereby a 500-μm-thick GaN film 15, which is a second semiconductor film, is grown through epitaxial growth on the GaN film 12.

Herein, because the mask 21 is made of $SiO_2$, which is a material that interferes with the epitaxial growth of GaN crystals, the GaN film 15 is not grown on the mask 21, and starts being grown through epitaxial growth on the GaN film 12 from portions positioned at the opening portions of the mask 21. When the GaN film 15 is grown through epitaxial growth to reach the top end of the mask 21, the GaN crystals are then grown through lateral growth along the surface of the mask 21.

Figure 3D:
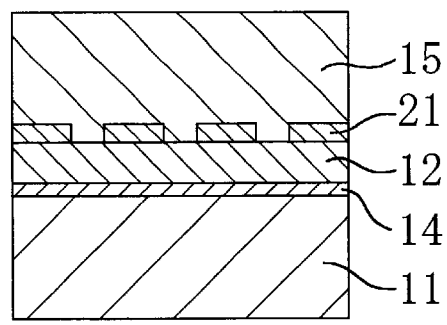

Then, as shown in FIG. 3D, the GaN crystals grown upward through the opening portions of the mask 21 and the GaN crystals grown through lateral growth along the surface of the mask 21 from the top end of each opening portion of the mask 21 are combined with each other, and eventually form the GaN film 15 that entirely covers the mask 21 and the opening portions thereof.

At this point, a defect, such as a dislocation caused by a lattice misfit between the GaN film 12 and the sapphire substrate 11 and extending in a vertical direction, is propagated through the GaN film 15 in the regions positioned above the opening portions of the mask 21. However, propagation of a defect, such as a dislocation present in the GaN film 12, is prevented through the GaN film 15 in the regions positioned above the mask 21, and substantially no dislocation is present in these regions. In the present embodiment, a density of dislocations of the GaN film 15 in the regions positioned above the mask 21 is one to two orders lower than that of the GaN film 15 manufactured in the first embodiment.

Figure 3E:
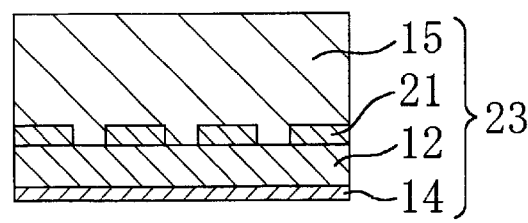

Subsequently, in the step shown in FIG. 3E, the temperature of the substrate is lowered to room temperature. At this point, even if the sapphire substrate 11 and the GaN films 12 and 15 adhere to each other by means of the thermal decomposition layer 14, because the thermal decomposition layer 14 is composed of a fluid including liquid-drops, a thermal stress resulting from a difference in coefficients of thermal expansion between the sapphire substrate 11 and the GaN films 12 and 15 is applied little to the GaN films 12 and 15. Then, the sapphire substrate 11 is separated and removed from the GaN films 12 and 15 and the mask 21. As a result, a GaN substrate 23 (free-standing nitride semiconductor wafer) having an area substantially as large as that of the sapphire substrate 11 is formed from the GaN films 12 and 15, the mask 21, and the thermal decomposition layer 14.

According to the present embodiment, the same advantages as those of the first embodiment can be exerted. In addition, according to the present embodiment, it is possible to obtain the GaN substrate 23 having partial regions where a density of dislocations is low.

The back surface of the GaN substrate 23, that is, the surface in contact with the sapphire substrate 11, may be polished until it becomes flat. Further, in case that the mask 21 made of $SiO_2$ causes inconveniences in the latter steps, the back surface may be polished until the GaN film 12 and the mask 21 are removed.

Also, in the present embodiment, laser light is irradiated after the mask 21 is formed, so that the GaN film 12 and the sapphire substrate 11 are separated from each other entirely at the interface. However, as was in the second embodiment, the contact between these components may be separated only at partial regions at the interface. In this case, the GaN substrate can be obtained by decomposing a contact portion with irradiation of a laser beam again or by removing the sapphire substrate 11 by means of grinding after the GaN film 15 is formed. Alternatively, the sapphire substrate 11 may be left intact, so that all the sapphire substrate 11 and the GaN films 12 and 15 are used as one substrate in fabricating a device, such as a laser element.

Also, in the present embodiment, a stripe-wise pattern is given as a plane pattern of the mask 21. However, the same advantages as those in the present embodiment can be attained whether the pattern is a dot-wise pattern, a tessellated pattern, etc.

Further, in the present embodiment, because the $SiO_2$ film is hardly deposited on the side surface of the sapphire substrate 11, the explanation was given on the precondition that the mask 21 does not cover the side surface of the sapphire substrate 11. However, by depositing a thicker $SiO_2$ film by means of CVD, it is possible to cover the side surface of the sapphire substrate 11 with the mask 21. In such a case, there can be offered extra advantages that the sapphire substrate can be removed more readily because the GaN films 12 and 15 are not deposited on the side surface of the sapphire substrate 11.

Fourth Embodiment

FIGS. 4A through 4F are partial cross sections (the illustration of the side surface of the substrate at the both ends is omitted herein) showing a manufacturing method of a semiconductor film according to a fourth embodiment of the present invention.

Figure 4A:
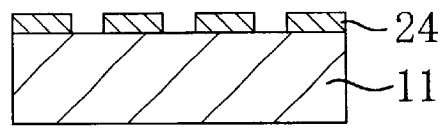
FIGS. 4A through 4F are partial cross sections showing a manufacturing method of a semiconductor film according to a fourth embodiment of the present invention.

In the step shown in FIG. 4A, a 100-nm-thick $SiO_2$ film is formed on a sapphire substrate 11 by means of sputtering, and the $SiO_2$ film is patterned by means of photolithography and wet etching, whereby a mask 24 made of $SiO_2$ is formed. The mask 24 has a stripe pattern having a width of 5 μm and a pitch interval of 5 μm, and the lengthwise direction of the stripe pattern is the <1–1 0 0> direction of the sapphire substrate 11.

Figure 4B:
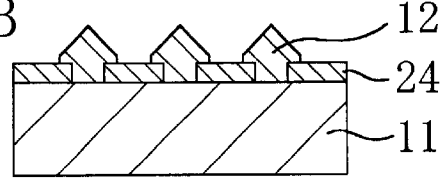

Then, in the step shown in FIG. 4B, the sapphire substrate 11 is introduced into an HVPE apparatus, and a 30-nm-thick GaN buffer layer (not shown) and a 80-μm-thick GaN film 12 are grown through epitaxial growth on the sapphire substrate 11 by the HVPE method. The conditions specified in the first embodiment are applied herein.

Herein, because the mask 24 is made of $SiO_2$, which is a material that interferes with the epitaxial growth of GaN crystals, the GaN film 12 is not grown on the mask 24, and starts being grown through epitaxial growth on the sapphire substrate 11 from portions positioned at the opening portions of the mask 24. When the GaN film 12 is grown through epitaxial growth to reach the top end of the mask 24, the GaN crystals are then grown through lateral growth along the surface of the mask 24.

Figure 4C:
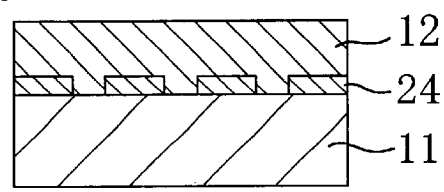

Then, as shown in FIG. 4C, the GaN crystals grown upward through the opening portions of the mask 24 and the GaN crystals grown through lateral growth along the surface of the mask 24 from the top end of each opening portion of the mask 24 are combined with each other, and eventually form the GaN film 12 that entirely covers the mask 24 and the opening portions thereof.

At this point, a defect, such as a dislocation caused by a lattice misfit between the GaN film 12 and the sapphire substrate 11 and extending in a vertical direction, is propagated through the GaN film 12 in the regions positioned above the opening portions of the mask 24. However, propagation of a defect, such as a dislocation, is prevented through the GaN film 12 in the regions positioned above the mask 24, and substantially no dislocation is present in these regions. In the present embodiment, a density of dislocations of the GaN film 12 in the regions positioned above the mask 24 is one to two orders lower than that of the GaN film 12 manufactured in the first embodiment.

Figure 4D:
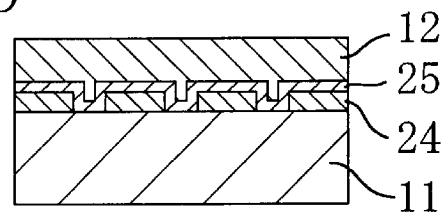

Then, in the step shown in FIG. 4D, the epitaxial substrate is taken out from the HVPE apparatus, and laser light is irradiated to the GaN film 12 (including the GaN buffer layer) from the back surface of the sapphire substrate 11, whereby the sapphire substrate 11 and GaN film 12 are separated from each other. A beam of laser specified in the first embodiment is also used herein.

At this point, the laser light passes through the sapphire substrate 11 and the mask 24, whereas the back surface portion of the GaN film 12 absorbs the laser light and generates heat. By increasing the energy density of the laser light satisfactorily, a portion of the GaN film 12 (including the GaN buffer layer) in contact with the sapphire substrate 11 and the mask 24, that is, the back surface portion, is decomposed in the vicinity of the interface by the heat thus generated. As a result, a portion of the GaN film 12 where laser light was irradiated is separated from the sapphire substrate 11 and from the mask 24. In the present embodiment, such a phenomenon can be confirmed when the energy density of the laser light is nearly 0.4 J/cm$^2$ or higher.

Hence, by scanning a beam of laser light to the sapphire substrate 11 entirely, a thermal decomposition layer 25 resulting from decomposition of GaN is disposed in a space between the substrate 11 and the GaN film 12 and between the mask 24 and the GaN film 12. The thermal decomposition layer 25 is generally a phase present as a mixture of liquid-drops of Ga, that is, droplets of Ga formed when N evaporates, and solid fine particles.

Because of the surface tension of the droplets of Ga produced at the time of decomposition, the GaN film 12 seldom peels off from the sapphire substrate 11.

Figure 4E:
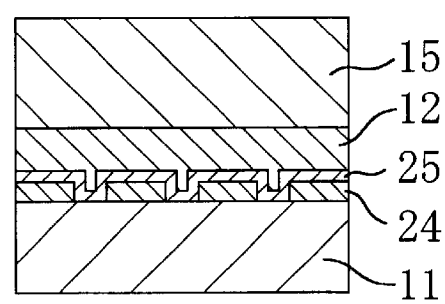

Then, in the step shown in FIG. 4E, the epitaxial substrate is introduced again into the HVPE apparatus while the GaN film 12 is placed on the sapphire substrate 11. Then, the epitaxial substrate is subjected to thermal cleaning by being heated to 700° C., after which the temperature of the epitaxial substrate is raised to 1000° C., whereby a 500-μm-thick GaN film 15, which is a second semiconductor film, is grown through epitaxial growth on the GaN film 12.

Figure 4F:
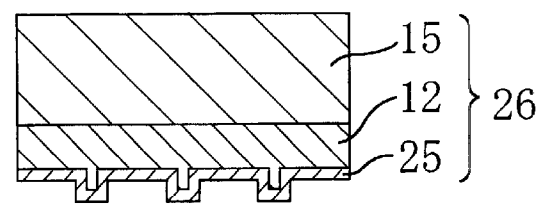

Subsequently, in the step shown in FIG. 4F, the temperature of the substrate is lowered to room temperature. At this point, even if the sapphire substrate 11 and the GaN films 12 and 15 adhere to each other by means of the thermal decomposition layer 25, because the thermal decomposition layer 25 is composed of a fluid including liquid-drops, a thermal stress resulting from a difference in coefficients of thermal expansion between the sapphire substrate 11 and the GaN films 12 and 15 is applied little to the GaN films 12 and 15. Then, the sapphire substrate 11 is separated and removed from the GaN film 12 and the GaN film 15. As a result, a GaN substrate 26 (free-standing nitride semiconductor wafer) having an area substantially as large as that of the sapphire substrate 11 is formed from the GaN films 12 and 15 and the thermal decomposition layer 25.

According to the present embodiment, the same advantages as those of the first embodiment can be exerted. In addition, according to the present embodiment, it is possible to lower a density of dislocations of the GaN film 12, and as a result, it is also possible to lower a density of dislocations of the GaN film 15 grown through epitaxial growth on the GaN film 12.

If the mask 24 is made of materials that do not transmit laser light, then the sapphire substrate 11 and the GaN film 12 remain adhering fixedly to each other through the mask 24. Even in such a case, it is possible to obtain the GaN substrate 26 by removing the mask 24 by means of wet etching following the removal of the sapphire substrate 11.

Also, in the present embodiment, the sapphire substrate 11 and the GaN film 12 are separated from each other entirely. However, as was in the second embodiment, these components may be separated only partially. In this case, the GaN substrate can be obtained by decomposing a portion of the GaN film 12 in contact with the sapphire substrate 11 with irradiation of a laser beam again or by removing the sapphire substrate 11 by means of grinding after the GaN film 15 is formed. Alternatively, the sapphire substrate 11 may be left intact, so that all the sapphire substrate 11 and the GaN films 12 and 15 are used as one substrate in fabricating a device, such as a laser element.

Also, a stripe is given as a shape of the mask 24. However, the same advantages can be attained whether the pattern is a dot-wise pattern, a tessellated pattern, etc.

Fifth Embodiment

In the first through fourth embodiments above, only the partial cross sections of the sapphire substrate 11 were illustrated, and the illustration of the side surface of the substrate at the both ends was omitted. However, it is general that the GaN film 12 (including GaN buffer layer) and the GaN film 15 by the HVPE method are grown through epitaxial growth also on the side surface of the sapphire substrate 11. Also, when the thermal decomposition layer is formed by irradiation of laser light, the back surface portion of the plane portion of the GaN film 12 is readily decomposed, but it is generally difficult to decompose a region in the vicinity of the interface of the GaN film 12 and the sapphire substrate 11 because laser light is hardly irradiated to the side surface portion. Hence, if the sapphire substrate 11 and the GaN films 12 and 15 are heated in trying to remove the sapphire substrate 11 later, for example, a crack may occur as a thermal stress is intensively applied to the outer circumference portion of the GaN films 12 and 15. In order to prevent such an inconvenience, it is necessary to cut the circumference of the sapphire substrate 11 by means of grinding or the like.

Thus, the present embodiment will describe a countermeasure that obviates such treatment.

FIGS. 5A through 5E are cross sections showing a manufacturing method of a semiconductor film according to a fifth embodiment of the present invention.

Figure 5A:
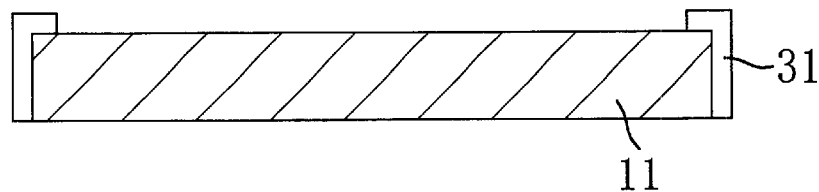
FIGS. 5A through 5E are cross sections showing a manufacturing method of a semiconductor film according to a fifth embodiment of the present invention.

In the step shown in FIG. 5A, a 100-nm-thick SiO$_2$ film is formed on the top surface and the side surface of a sapphire substrate 11 by means of CVD, and the SiO$_2$ film is patterned by means of photolithography and wet etching, whereby a mask 31 made of SiO$_2$ is formed. The mask 31 covers the side surface and the outer circumference portion of the top surface of the sapphire substrate 11.

Figure 5B:
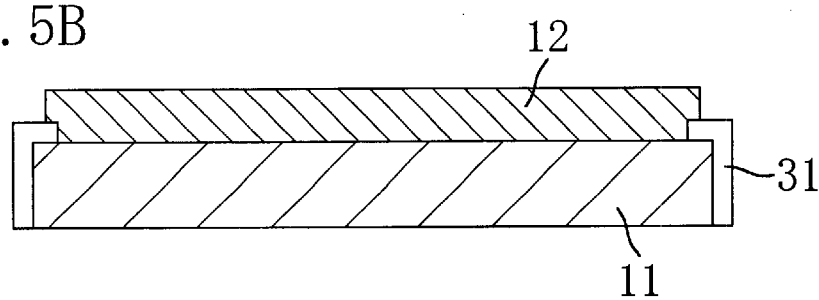

Then, in the step shown in FIG. 5B, the sapphire substrate 11 is introduced into an HVPE apparatus, and a 30-nm-thick GaN buffer layer (not shown) and a 50-μm-thick GaN film 12 are grown through epitaxial growth on the sapphire substrate 11 by the HVPE method. The conditions specified in the first embodiment are applied herein.

Herein, because the mask 31 is made of $SiO_2$, which is a material that interferes with the epitaxial growth of GaN crystals, the GaN film 12 is not grown on the mask 31, and starts being grown through epitaxial growth on the sapphire substrate 11 from a portion positioned at the opening portion of the mask 31. When the GaN film 12 is grown through epitaxial growth to reach the top end of the mask 31, the GaN crystals are then grown through lateral growth to the side surface along the surface of the mask 31. Hence, the GaN crystals eventually form the GaN film 12 that not only covers the opening portion of the mask 31, but also the peripheral portion of the opening portion of the mask 31.

Figure 5C:
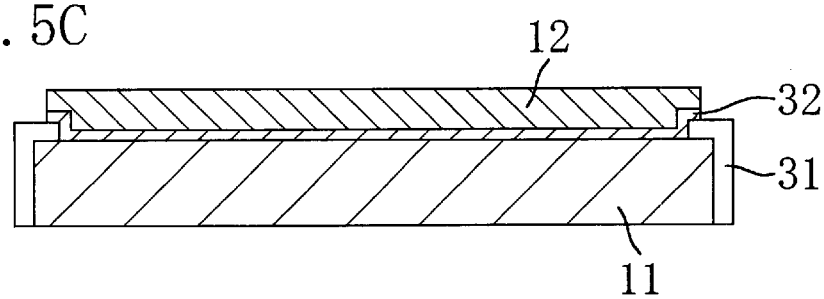

Then, in the step shown in FIG. 5C, the epitaxial substrate is taken out from the HVPE apparatus, and laser light is irradiated to the GaN film 12 (including the GaN buffer layer) from the back surface of the sapphire substrate 11, whereby the sapphire substrate 11 and GaN film 12 are separated from each other. A beam of laser light specified in the first embodiment is also used herein.

At this point, the laser light passes through the sapphire substrate 11 and the mask 31, whereas the back surface portion of the GaN film 12 absorbs the laser light and generates heat. By increasing the energy density of the laser light satisfactorily, a portion of the GaN film 12 (including the GaN buffer layer) in contact with the sapphire substrate 11 and the mask 31, that is, the back surface portion, is decomposed in the vicinity of the interface by the heat thus generated. As a result, a portion of the GaN film 12 where laser light was irradiated is separated from the sapphire substrate 11 and from the mask 31. In the present embodiment, such a phenomenon can be confirmed when the energy density of the laser light is nearly 0.4 $J/cm^2$ or higher.

Hence, by scanning a beam of laser light to the sapphire substrate 11 entirely, a thermal decomposition layer 32 resulting from decomposition of GaN is disposed entirely in a space between the sapphire substrate 11 and the GaN film 12 and between the mask 31 and the GaN film 12. The thermal decomposition layer 32 is generally a phase present as a mixture of liquid-drops of Ga, that is, droplets of Ga formed when N evaporates, and solid fine particles.

Because of the surface tension of the droplets of Ga produced at the time of decomposition, the GaN film 12 seldom peels off from the sapphire substrate 11.

Figure 5D:
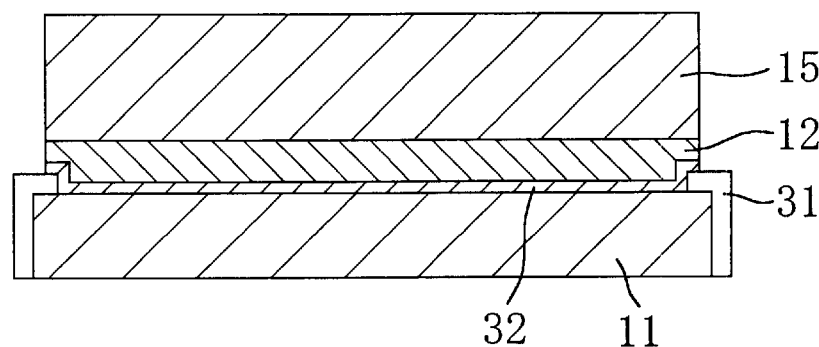

Then, in the step shown in FIG. 5D, the epitaxial substrate is introduced again into the HVPE apparatus while the GaN film 12 is placed on the sapphire substrate 11. Then, the epitaxial substrate is subjected to thermal cleaning by being heated to 700° C., after which the temperature of the epitaxial substrate is raised to 1000° C., whereby a 500-μm-thick GaN film 15, which is a second semiconductor film, is grown through epitaxial growth on the GaN film 12.

Figure 5E:
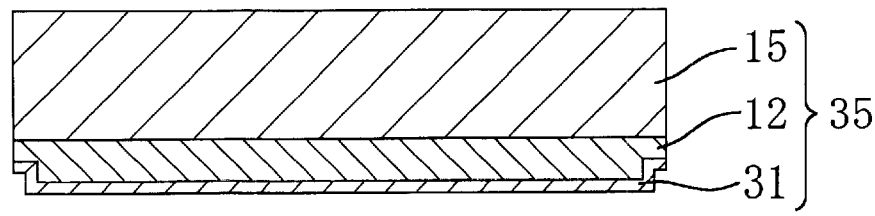

Subsequently, in the step shown in FIG. 5E, the temperature of the substrate is lowered to room temperature. At this point, even if the sapphire substrate 11 and the GaN films 12 and 15 adhere to each other by means of the thermal decomposition layer 32, because the thermal decomposition layer 32 is composed of a fluid including liquid-drops, a thermal stress resulting from a difference in coefficients of thermal expansion between the sapphire substrate 11 and the GaN films 12 and 15 is applied little to the GaN films 12 and 15. Then, the sapphire substrate 11 is separated and removed from the GaN film 12 and the GaN film 15. As a result, a GaN substrate 35 (free-standing nitride semiconductor wafer) having an area substantially as large as that of the sapphire substrate 11 is formed from the GaN films 12 and 15 and the thermal decomposition layer 32.

According to the present embodiment, the same advantages as those of the first embodiment can be exerted. In addition, according to the present embodiment, the GaN crystals are not grown on the side surface of the sapphire substrate 11, and for this reason, it is possible to decompose the back surface portion of the GaN film 12 in contact with the sapphire substrate 11 entirely in a reliable manner. As a result, the GaN films 12 and 15 and the sapphire substrate 11 can be separated from each other smoothly, thereby making it possible to obtain a free-standing GaN wafer (nitride semiconductor wafer) with satisfactory reproducibility.

In the present embodiment also, by covering the sapphire substrate 11 with the mask 31 almost entirely and providing opening portions partially like in the fourth embodiment, it is possible to lower a density of dislocations.

Also, in the present embodiment, as was in the second embodiment, the contact between the GaN film 12 and the sapphire substrate 11 may be separated only at partial regions at the interface thereof by irradiating laser light. In this case, the GaN substrate can be obtained by decomposing a contact portion with irradiation of laser light again or by removing the sapphire substrate 11 by means of grinding after the GaN film 15 is formed. Alternatively, the sapphire substrate 11 may be left intact, so that all the sapphire substrate 11 and the GaN films 12 and 15 are used as one substrate in fabricating a device, such as a laser element.

Sixth Embodiment

FIGS. 6A through 6E are partial cross sections (the illustration of the side surface of the substrate at the both ends is omitted herein) showing a manufacturing method of a semiconductor film according to a sixth embodiment of the present invention.

Figure 6A:
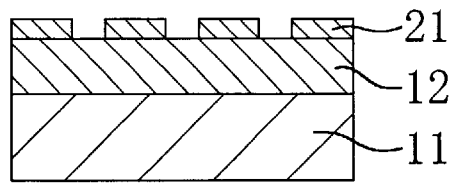
FIGS. 6A through 6E are partial cross sections showing a manufacturing method of a semiconductor film according to a sixth embodiment of the present invention.

In the step shown in FIG. 6A, the same treatment as the one in the step shown in FIG. 1A of the first embodiment is applied. More specifically, a 30-nm-thick GaN buffer layer (not shown) and a 10-μm-thick GaN film 12 are grown through epitaxial growth on a sapphire substrate 11 by the HVPE method. The conditions specified in the first embodiment are applied herein.

In the present embodiment also, the phrase "GaN film 12" is construed to include the GaN buffer layer unless otherwise specified. In addition, the sapphire substrate 11 with the GaN film 12 or the like formed thereon is simply referred to as the epitaxial substrate.

Then, the sapphire substrate 11 and the GaN film 12 are cooled to room temperature within the HVPE apparatus.

Subsequently, a 100-nm-thick $SiO_2$ film is formed on the GaN film 12 by means of sputtering, and the $SiO_2$ film is patterned by means of photolithography and wet etching, whereby a mask 21 made of $SiO_2$ is formed. The mask 21 has a stripe pattern having a width of 10 μm and a pitch interval of 5 μm, and the lengthwise direction of the stripe pattern is the <1 1–2 0> direction of the GaN film 12.

Figure 6B:
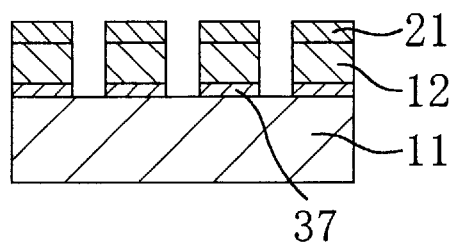

Then, in the step shown in FIG. 6B, regions of the GaN film 12 positioned at the opening portions of the mask 21 are etched away by means of reactive ion etching until the sapphire substrate 11 is exposed.

Subsequently, the epitaxial substrate is taken out from the HVPE apparatus, and laser light is irradiated to the GaN film 12 (including the GaN buffer layer) from the back surface of the sapphire substrate 11, whereby the sapphire substrate 11 and GaN film 12 are separated from each other. A beam of laser and a beam spot of the laser light specified in the first embodiment are also used herein. At this point, a beam of laser light scans the sapphire substrate 11 linearly in the <1-1 0 0> direction of the GaN film 12 that intersects at right angles with the lengthwise direction of the stripe pattern of the mask 21, and this linear scanning is repeated with a pitch interval of 1 mm in the direction intersecting at the right angles with the <1-1 0 0> direction. Hence, by scanning a beam of laser light across the sapphire substrate 11, a thermal decomposition layer 37 resulting from decomposition of GaN is disposed in a dot-wise manner in a space between the sapphire substrate 11 and the GaN film 12. The thermal decomposition layer 37 is generally a phase present as a mixture of liquid-drops of Ga, that is, droplets of Ga formed when N evaporates, and solid fine particles.

Figure 6C:
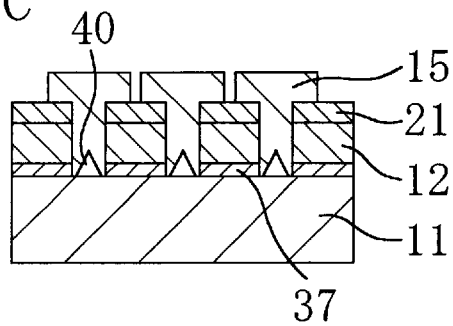

Then, in the step shown in FIG. 6C, the epitaxial substrate is introduced again into the HVPE apparatus while the GaN film 12 is placed on the sapphire substrate 11. Then, the epitaxial substrate is subjected to thermal cleaning by being heated to 700° C., after which the temperature of the epitaxial substrate is raised to 1000° C., whereby a 500-$\mu$m-thick GaN film 15, which is a second semiconductor film, is grown through epitaxial growth on the GaN film 12.

Herein, the mask 21 is made of $SiO_2$, which is a material that interferes with the epitaxial growth of GaN crystals. Also, portions of the GaN film 12 positioned at the opening portions of the mask 21 have been removed. Thus, the GaN film 15 is not grown on the mask 21, and starts being grown through epitaxial growth from the side surfaces of the GaN film 12 exposed to the opening portions of the mask 21, and on the sapphire substrate 11 from portions exposed through the opening portions of the mask 21. At this point, because GaN crystals are grown in the lateral direction from the side surfaces of the GaN film 12, GaN crystals grown through lateral growth from the side surfaces opposing each other within the opening portions are eventually combined with each other, whereupon a supply of the raw material to the bottom surface of the opening portions is stopped, and so is the epitaxial growth from the sapphire substrate 11. Meanwhile, when the GaN film 15 is grown through epitaxial growth to reach the top end of the mask 21, the GaN crystals are then grown through lateral growth along the surface of the mask 21.

Figure 6D:
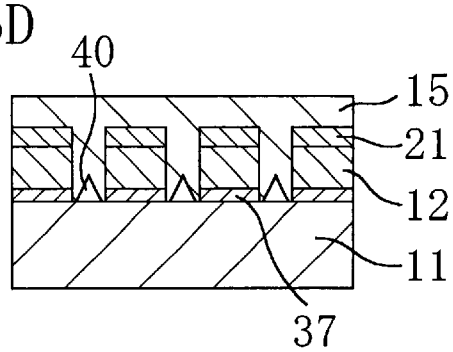

Then, as shown in FIG. 6D, the GaN crystals grown upward through the opening portions of the mask 21 and the GaN crystals grown through lateral growth along the surface of the mask 21 from the top end of each opening portion of the mask 21 are combined with each other, and eventually form the GaN film 15 that entirely covers the mask 21 and the opening portions thereof.

At this point, most of the GaN film 15 is composed of GaN crystals grown through lateral growth from the GaN film 12. Hence, propagation of a defect, such as a dislocation caused by a lattice misfit between the GaN film 12 and the sapphire substrate 11 and extending in a vertical direction, is prevented through the GaN film 15, and substantially no dislocation is present in the GaN film 15. In the present embodiment, a density of dislocations in all the regions of the GaN film 15 is one to two orders lower than that of the GaN film 15 manufactured in the first embodiment.

Figure 6E:
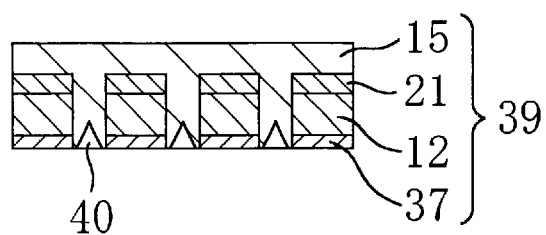

Subsequently, in the step shown in FIG. 6E, the temperature of the substrate is lowered to room temperature. At this point, the sapphire substrate 11 and the GaN films 12 and 15 may be adhering to each other by means of the thermal decomposition layer 37. However, the thermal decomposition layer 37 is composed of a fluid including liquid-drops. Also, gaps 40 are produced at the respective opening portions of the mask 21 due to the suspension of a supply of the raw material. Hence, the sapphire substrate 11 and the GaN films 12 and 15 are in contact with each other only at portions where laser light was irradiated. This makes a thermal stress resulting from a difference in coefficients of thermal expansion between the sapphire substrate 11 and the GaN films 12 and 15 and applied to the GaN films 12 and 15 extremely small. Then, the sapphire substrate 11 is separated and removed from the GaN films 12 and 15 and the mask 21. As a result, a GaN substrate 39 (free-standing nitride semiconductor wafer) having an area substantially as large as that of the sapphire substrate 11 can be obtained from the GaN films 12 and 15, the mask 21, and the thermal decomposition layer 37.

According to the present embodiment, the same advantages as those of the first embodiment can be exerted. In addition, according to the present embodiment, because most of the GaN film 15 is composed of GaN crystals grown through lateral growth from the GaN film 12, it is possible to obtain a good-quality GaN film 15 having an extremely low density of dislocations.

Also, because the gaps are produced at the opening portions of the mask 21 when a supply of the raw material is stopped in the step shown in FIG. 6D, an area of the contact portions is reduced, and so is a thermal stress that would cause a breaking or a chipping at the time of cooling.

The back surface of the GaN substrate 39, that is, the surface in contact with the sapphire substrate 11, may be polished until it becomes flat. Further, in case that the mask 21 made of $SiO_2$ causes inconveniences in the latter steps, the back surface may be polished until the GaN film 12 and the mask 21 are removed.

Also, in the present embodiment, laser light is irradiated after the mask 21 is formed, so that the GaN film 12 is separated from the sapphire substrate 11 partially at the interface. However, these components may be separated entirely at the interface thereof.

Also, in the present embodiment, the sapphire substrate 11 is removed from the GaN films 12 and 15. However, the sapphire substrate 11 may be left intact, so that all the sapphire substrate 11 and the GaN films 12 and 15 are used as one substrate in fabricating a device, such as a laser element.

Seventh Embodiment

FIGS. 7A through 7E are partial cross sections (the illustration of the side surface of the substrate at the both ends is omitted herein) showing a manufacturing method of a semiconductor film according to a seventh embodiment of the present invention.

Figure 7A:
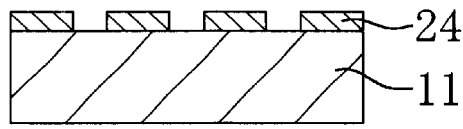
FIGS. 7A through 7E are partial cross sections showing a manufacturing method of a semiconductor film according to a seventh embodiment of the present invention.

In the step shown in FIG. 7A, a 100-nm-thick $SiO_2$ film is formed on a sapphire substrate 11 by means of CVD, and the $SiO_2$ film is patterned by means of photolithography and wet etching, whereby a mask 24 made of $SiO_2$ is formed. The mask 24 has a stripe pattern having a width of 5 $\mu$m and a pitch interval of 5 $\mu$m, and the lengthwise direction of the stripe pattern is the <1-1 0 0> direction of the sapphire substrate 11.

Figure 7B:
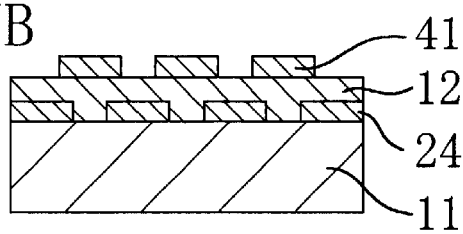

Then, in the step shown in FIG. 7B, the sapphire substrate 11 is introduced into an HVPE apparatus, and a 30-nm-thick GaN buffer layer (not shown) and a 50-$\mu$m-thick GaN film 12 are grown through epitaxial growth on the sapphire substrate 11 by the HVPE method. The conditions specified in the first embodiment are applied herein.

Herein, because the mask 24 is made of $SiO_2$, which is a material that interferes with the epitaxial growth of GaN crystals, the GaN film 12 is not grown on the mask 24, and starts being grown through epitaxial growth on the sapphire substrate 11 from portions positioned at the opening portions of the mask 24. When the GaN film 12 is grown through epitaxial growth to reach the top end of the mask 24, the GaN crystals are then grown through lateral growth along the surface of the mask 24.

Then, the GaN crystals grown upward through the opening portions of the mask 24 and the GaN crystals grown through lateral growth along the surface of the mask 24 from the top end of each opening portion of the mask 24 are combined with each other, and eventually form the GaN film 12 that entirely covers the mask 24 and the opening portions thereof.

At this point, a defect, such as a dislocation caused by a lattice misfit between the GaN film 12 and the sapphire substrate 11 and extending in a vertical direction, is propagated through the GaN film 12 in the regions positioned above the opening portions of the mask 24. However, propagation of a defect, such as a dislocation, is prevented through the GaN film 12 in the regions positioned above the mask 24, and substantially no dislocation is present in these regions.

Figure 7C:
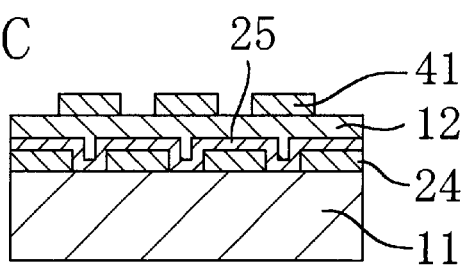

Then, in the step shown in FIG. 7C, a 100-nm-thick $SiO_2$ film is formed on the GaN film 12 by means of sputtering, and the $SiO_2$ film is patterned by means of photolithography and wet etching, whereby a mask 41 made of $SiO_2$ is formed. The mask 41 has a stripe pattern having a width of 5 $\mu$m and a pitch interval of 5 $\mu$m, and covers above the opening portions of the mask 24.

Also, in the step shown in FIG. 7C, the epitaxial substrate is taken out from the HVPE apparatus, and laser light is irradiated to the GaN film 12 (including the GaN buffer layer) from the back surface of the sapphire substrate 11, whereby the sapphire substrate 11 and GaN film 12 are separated from each other. A beam of laser light specified in the first embodiment is also used herein.

At this point, the laser light passes through the sapphire substrate 11 and the mask 24, whereas the back surface portion of the GaN film 12 absorbs the laser light and generates heat. By increasing the energy density of the laser light satisfactorily, a portion of the GaN film 12 (including the GaN buffer layer) in contact with the sapphire substrate 11 and the mask 24, that is, the back surface portion, is decomposed in the vicinity of the interface by the heat thus generated. As a result, a region of the GaN film 12 where laser light was irradiated is separated from the sapphire substrate 11 and from the mask 24. In the present embodiment, such a phenomenon can be confirmed when the energy density of the laser light is nearly 0.4 $J/cm^2$ or higher.

Hence, by scanning a beam of laser light to the sapphire substrate 11 entirely, a thermal decomposition layer 25 resulting from decomposition of GaN is disposed in a space between the sapphire substrate 11 and the GaN film 12 and between the mask 24 and the GaN film 12. The thermal decomposition layer 25 is generally a phase present as a mixture of liquid-drops of Ga, that is, droplets of Ga formed when N evaporates, and solid fine particles.

Because of the surface tension of the droplets of Ga produced at the time of decomposition, the GaN film 12 seldom peels off from the sapphire substrate 11.

Figure 7D:
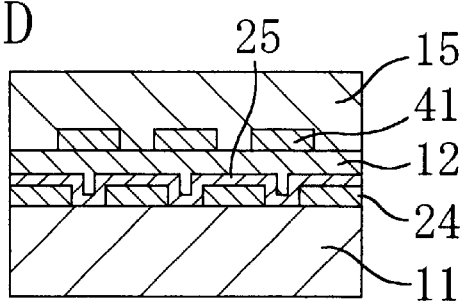

Then, in the step shown in FIG. 7D, the epitaxial substrate is introduced again into the HVPE apparatus while the GaN film 12 is placed on the sapphire substrate 11. Then, the epitaxial substrate is subjected to thermal cleaning by being heated to 700° C., after which the temperature of the epitaxial substrate is raised to 1000° C., whereby a 500-$\mu$m-thick GaN film 15, which is a second semiconductor film, is grown through epitaxial growth on the GaN film 12.

At this point, because the mask 41 is made of $SiO_2$, which is a material that interferes with the epitaxial growth of GaN crystals, the GaN film 15 is not grown on the mask 41, and starts being grown through epitaxial growth on the GaN film 12 from portions positioned at the opening portions of the mask 41. When the GaN film 15 is grown through epitaxial growth to reach the top end of the mask 41, the GaN crystals are then grown through lateral growth along the surface of the mask 41.

Then, the GaN crystals grown upward through the opening portions of the mask 41 and the GaN crystals grown through lateral growth along the surface of the mask 41 from the top end of each opening portion of the mask 41 are combined with each other, and eventually form the GaN film 15 that entirely covers the mask 41 and the opening portions thereof.

At this point, regions of the GaN film 12 positioned above the opening portions of the mask 24, that is, regions to which a defect, such as a dislocation, is propagated, is covered with the mask 41, which makes it possible to prevent propagation of a defect, such as a dislocation, to the GaN film 15. On the other hand, the GaN film 15 is grown through epitaxial growth on the regions of the GaN film 12 positioned above the mask 24, that is, regions to which a defect, such as a dislocation, is seldom propagated, and for this reason, the GaN film 15 as a whole forms a low dislocation density region. In the present embodiment, a density of dislocations in the GaN film 15 as a whole is one to two orders lower than that of the GaN film 15 manufactured in the first embodiment.

Figure 7E:
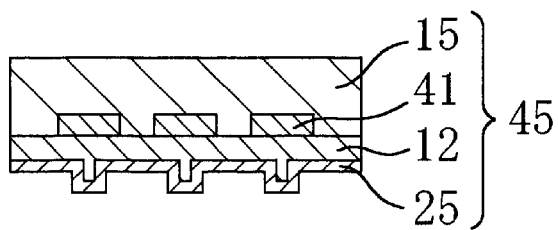

Subsequently, in the step shown in FIG. 7E, the temperature of the substrate is lowered to room temperature. At this point, even if the sapphire substrate 11 and the GaN films 12 and 15 adhere to each other by means of the thermal decomposition layer 25, because the thermal decomposition layer 25 is composed of a fluid including liquid-drops, a thermal stress resulting from a difference in coefficients of thermal expansion between the sapphire substrate 11 and the GaN films 12 and 15 is applied little to the GaN films 12 and 15. Then, the sapphire substrate 11 is separated and removed from the GaN films 12 and 15 and from the masks 24 and 41. As a result, a GaN substrate 45 (free-standing nitride semiconductor wafer) having an area substantially as large as that of the sapphire substrate 11 is formed from the GaN films 12 and 15, the masks 24 and 41, and the thermal decomposition layer 25.

According to the present embodiment, the same advantages as those of the first embodiment can be exerted. In addition, according to the present embodiment, it is possible to obtain the GaN substrate 45 having regions with a low density of dislocations as a whole.

The back surface of the GaN substrate 45, that is, the surface in contact with the sapphire substrate 11, may be polished until it becomes flat. Further, in case that the masks 24 and 41 made of $SiO_2$ cause inconveniences in the latter steps, the back surface may be polished until the GaN film 12 and the masks 24 and 41 are removed.

Also, in the present embodiment, laser light is irradiated after the masks 24 and 41 are formed, so that the GaN film 12 is separated from the sapphire substrate 11 entirely at the interface. However, as was in the second embodiment, the contact between these components may be separated only at partial regions at the interface. In this case, the GaN substrate can be obtained by decomposing a contact portion with irradiation of a laser beam again or by removing the sapphire substrate 11 by means of grinding after the GaN film 15 is formed. Alternatively, the sapphire substrate 11 may be left intact, so that all the sapphire substrate 11 and the GaN films 12 and 15 are used as one substrate in fabricating a device, such as a laser element.

Also, a stripe-wise pattern is given as a plane pattern of the mask 24 in the present embodiment. However, the same advantages as those in the present embodiment can be achieved whether the pattern is a dot-wise pattern, a tessellated pattern, etc.

Further, in the present embodiment, because the side surface of the sapphire substrate 11 is also covered with the mask 24 made of the $SiO_2$ film, the GaN films 12 and 15 are not deposited on the side surface of the sapphire substrate 11, which offers extra advantages that the sapphire substrate can be removed more readily.

EXAMPLE

The present example will describe a light emitting diode fabricated by using the GaN wafer (GaN film 15) manufactured in any of the embodiments above.

Initially, an n-type GaN crystalline film having a thickness of approximately 4 μm is grown through epitaxial growth on the GaN wafer by using a metal organic vapor phase epitaxy apparatus. Herein, a crystal growth temperature is 1030° C., trimethylgallium is used as a Ga raw material, and $NH_3$ is used as a N raw material. Also, $SiH_4$ is used as a raw material of Si serving as a donor impurity, and $H_2$ is used as a carrier gas. Then, the carrier gas is switched to $N_2$ and the crystal growth temperature is lowered to 800° C., whereby an n-type InGaN crystalline film having a thickness of approximately 20 nm is grown through epitaxial growth on the n-type GaN crystalline film. Herein, trimethylindium is used as a raw material of In. Subsequently, the crystal growth temperature is raised again to 1020° C., whereby a p-type GaN crystalline film having a thickness of approximately 800 nm is grown through epitaxial growth. Herein, cyclopentadienylmagnesium is used as a raw material of Mg serving as an acceptor impurity.

Then, after the p-type GaN crystalline film is grown through epitaxial growth, the GaN wafer is subjected to annealing at 700° C. for 20 minutes in a nitrogen atmosphere by an annealing device, so that resistivity of the uppermost p-type GaN crystalline film is further reduced.

Then, after the annealing, a Ti/Al electrode of a multi-layer structure is formed on the n-type GaN crystalline film as an ohmic electrode, and a Ni/Au electrode is formed on the p-type GaN crystalline film. Subsequently, the wafer is cut, and divided into chips of 500 μm square, each of which is used as a light emitting diode.

An evaluation of characteristics of these light emitting diodes reveals that quite satisfactory characteristics are obtained with respect to the entire substrate.

In view of the foregoing results, it is understood that according to the manufacturing methods of the present invention, a breaking or warpage (distortion) in the GaN film 15 can be controlled, thereby making it possible to enhance a yield of the light emitting diodes or semiconductor lasers.

Other Embodiments

In each of the embodiments above, the sapphire substrate measuring two inches across was used. However, by using a sapphire substrate of a larger area or a substrate made of other materials, it is still possible to manufacture a nitride semiconductor substrate while controlling a breaking or a chipping.

In addition, in each of the embodiments above, a beam of laser from a Nd/YAG laser was used in separating the sapphire substrate from the GaN film, but any beam of laser can be used as long as it has a wavelength corresponding to energy larger than the absorption edge of the nitride semiconductor and can penetrate the substrate. For example, a beam of laser from a KrF excimer laser (248 nm) or from a XeCl excimer laser (308 nm) is also applicable for use in separation.

Also, when the nitride semiconductor film (GaN film in each of the embodiments above) that corresponds to the nitride semiconductor substrate is manufactured, it may be arranged in such a manner that a raw material including the group II, IV, or VI elements is used and the raw material is added to the group II, IV, or VI elements. For example, a nitride semiconductor substrate having n-type conduction can be obtained by adding Si, Ge, Se, etc. as an impurity, whereas a nitride semiconductor substrate having p-type conduction can be obtained by adding Be, Mg, Zn, etc. as an impurity.

In the third, fourth, fifth, sixth, and seventh embodiments, the silicon dioxide ($SiO_2$) film was used as a material of the mask, but any material can be used as long as substantially no nitride semiconductor is grown thereon. For example, oxides, such as titanium oxide ($TiO_x$) and zirconium oxide ($ZrO_x$), nitrides, such as silicon nitride ($Si_xN_y$), high-melting point metal (refractory metal), such as Ni, Mo, W, and Co, etc. can be used as a material of the mask.

Also, in each of the embodiments above, $H_2$ or a mixed gas of $N_2/H_2$ may be used as the carrier gas used when forming the GaN film.

Further, each of the embodiments above described a case where a GaN film is formed on the sapphire substrate or where a free-standing GaN substrate (GaN wafer) is manufactured. It should be appreciated, however, that the manufacturing methods of a semiconductor film of the present invention are not limited to the manufacturing of a GaN film or a GaN substrate, and is also applicable in manufacturing any other kind of semiconductor film (or a semiconductor substrate) including nitrogen, and the same advantages can be obtained in each case. In short, the present invention can be applied to a semiconductor film (or a semiconductor substrate) including N and at least one element selected from Ga, Al, B, As, In, P and Sb in its composition. A typical example is a semiconductor film (or a semiconductor substrate) expressed by a general formula $B_xAl_yGa_zIn_{1-x-y-z}N$, where $0 \leq x \leq 1$, $0 \leq y \leq 1$, $0 \leq z \leq 1$, and $0 \leq x+y+z \leq 1$, and to be more concrete, the examples include an AlN film (or an AlN substrate), an AlGaN film (or an AlGaN substrate), an InGaN film (or an InGaN substrate), an AlGaInN film (or an AlGaInN substrate), a BN film (or a BN substrate), a BAlN film (a BAlN substrate), a BGaN film (or a BGaN substrate), etc.

Also, the sapphire substrate was used as a substrate that will be used as an underlying substrate when forming a semiconductor film or a semiconductor substrate of the present invention in each of the embodiments above. However, when a light transmitting substrate other than the sapphire substrate, such as a spinel substrate, is used, laser light also can pass through the substrate, and therefore, it is possible to separate the substrate from the GaN film by exploiting the properties that laser light is absorbed only into the GaN film.

Herein, laser light having energy larger than a bandgap of GaN needs to be used, and besides the third harmonics from the Nd/YAG laser, laser light from an excimer KrF laser (wavelength: 248 nm) or the like is preferably used.

What is claimed is:

1. A manufacturing method of a semiconductor film, comprising:

a step (a) of forming a first semiconductor film on a light transmitting substrate;

a step (b) of separating contact between said substrate and said first semiconductor film at least at a part of an interface thereof by irradiating light in a space between said substrate and said first semiconductor film; and a step (c) of allowing growth of a second semiconductor film on said first semiconductor film while said first semiconductor film is placed on said substrate, at least said first and second semiconductor films being used as a semiconductor substrate.

2. The manufacturing method of a semiconductor film according to claim 1, wherein:

in said step (b), at least a part of a region of said first semiconductor film adjacent to said substrate is turned into a thermal decomposition layer.

3. The manufacturing method of a semiconductor film according to claim 1, wherein:

in said step (b), the contact between said first semiconductor film and said substrate is separated at the interface thereof almost entirely.

4. The manufacturing method of a semiconductor film according to claim 1, wherein:

in said step (b), the contact between said first semiconductor film and said substrate is separated only at a part of the interface thereof.

5. The manufacturing method of a semiconductor film according to claim 1, wherein:

in said step (a), a compound semiconductor film including nitrogen is formed as said first semiconductor film.

6. The manufacturing method of a semiconductor film according to claim 5, wherein:

in said step (a), a compound semiconductor film including N and at least one element selected from the group consisting of Ga, Al, B, As, In, P and Sb in a composition thereof is formed as said first semiconductor film.

7. The manufacturing method of a semiconductor film according to claim 1, wherein:

in said step (c), a compound semiconductor film including nitrogen is formed as said second semiconductor film.

8. The manufacturing method of a semiconductor film according to claim 7, wherein:

in said step (c), a compound semiconductor film including N and at least one element selected from the group consisting of Ga, Al, B, As, In, P and Sb in a composition thereof is formed as said second semiconductor film.

9. The manufacturing method of a semiconductor film according to claim 1, wherein:

in said step (a), a thickness of said first semiconductor film is set to 200 $\mu$m or less.

10. The manufacturing method of a semiconductor film according to claim 1, wherein:

in said step (b), a value of irradiation energy of said light is in a range from 0.1 J/cm$^2$ to 20 J/cm$^2$ both inclusive.

11. The manufacturing method of a semiconductor film according to claim 1, further comprising:

a step (d) of removing said substrate after said step (c).

* * * * *

UNITED STATES PATENT AND TRADEMARK OFFICE
CERTIFICATE OF CORRECTION

PATENT NO. : 6,589,857 B2
DATED : July 8, 2003
INVENTOR(S) : Masahiro Ogawa et al.

It is certified that error appears in the above-identified patent and that said Letters Patent is hereby corrected as shown below:

<u>Title page</u>,
Item [75], Inventors, delete cities "Higashiosaka, Ibaraki and Hirakata" and insert
-- Osaka --.

Signed and Sealed this

Fourth Day of May, 2004

JON W. DUDAS
*Acting Director of the United States Patent and Trademark Office*